(12) United States Patent
Huang et al.

(10) Patent No.: US 9,720,038 B2
(45) Date of Patent: Aug. 1, 2017

(54) METHOD AND CIRCUIT OF PULSE-VANISHING TEST

(71) Applicant: Mentor Graphics Corporation, Wilsonville, OR (US)

(72) Inventors: Shi-Yu Huang, Taoyuan County (TW); Kun-Han Tsai, Lake Oswego, OR (US); Wu-Tung Cheng, Lake Oswego, OR (US); Jeo-Yen Lee, Taipei (TW)

(73) Assignee: Mentor Graphics, A Siemens Business, Wilsonville, OR (US)

( * ) Notice: Subject to any disclaimer, the term of this patent is extended or adjusted under 35 U.S.C. 154(b) by 393 days.

(21) Appl. No.: 14/281,231

(22) Filed: May 19, 2014

(65) Prior Publication Data

US 2014/0347088 A1    Nov. 27, 2014

Related U.S. Application Data

(60) Provisional application No. 61/846,515, filed on Jul. 15, 2013, provisional application No. 61/827,502, filed on May 24, 2013.

(51) Int. Cl.
*G01R 31/317* (2006.01)
*G01R 31/3185* (2006.01)

(52) U.S. Cl.
CPC . *G01R 31/31717* (2013.01); *G01R 31/31855* (2013.01)

(58) Field of Classification Search
CPC .................. G01R 31/3171; G01R 31/31855
See application file for complete search history.

(56) References Cited

U.S. PATENT DOCUMENTS

| | | | |
|---|---|---|---|
| 2007/0157058 A1* | 7/2007 | Park ................ | G01R 31/31855 714/727 |
| 2012/0221906 A1* | 8/2012 | Shetty .............. | G01R 31/31855 714/727 |
| 2014/0281773 A1* | 9/2014 | Goel ................. | G11C 29/50 714/726 |

OTHER PUBLICATIONS

Huang, "VLSI Test Principles and Architectures", edited by: Laung-Terng Wang, et al. (Chapter 10—Boundary Scan and Core-Based Testing, Lee), ISBN: 978-0-12-370597-6, Copyright © 2006 Elsevier Inc.*

(Continued)

*Primary Examiner* — April Y Blair
*Assistant Examiner* — Rong Tang

(57) ABSTRACT

Various aspects of the disclose techniques relate to techniques of testing interconnects in stacked designs. A single-pulse signal, generated by a first circuit state element on a first die, is applied to a first end of an interconnect and captured at a second end of the interconnect using a clock port of a second circuit state element on a second die. A faulty interconnect may cause the single-pulse signal too distorted to reach the threshold voltage of the second circuit element.

10 Claims, 14 Drawing Sheets

(56) References Cited

OTHER PUBLICATIONS

Kuphaldt, "Lessons in Electric Circuits, vol. IV—Digital", Fourth Edition, Nov. 1, 2007, (p. 327, Chapter 11.2. Asynchronous Counters).*

Y.-H. Lin, S.-Y. Huang, K.-H. Tsai, W.-T. Cheng, S. Sunter, Y.-F. Chou, and D.-M. Kwai, "Small Delay Testing for TSVs in 3D ICs," IEEE Proc. of Design Automation Conf., Jun. 2012.

R. Pendurkar, A. Chatterjee, Y. Zorian, "Switching Activity Generation with Automated BIST Synthesis for Performance Testing of Interconnects", IEEE Trans. on Computer-Aided Design of Integrated Circuits and Systems, vol. 20, No. 9. pp. 1143-1158, Sep. 2001.

F. Ye and K. Chakrabarty, "TSV Open Defects in 3D Integrated Circuits: Characterization, Test, and Optimal Spare Allocation", Proc. of Design Automation Conf., pp. 10240-1030, Jun. 2012.

\* cited by examiner

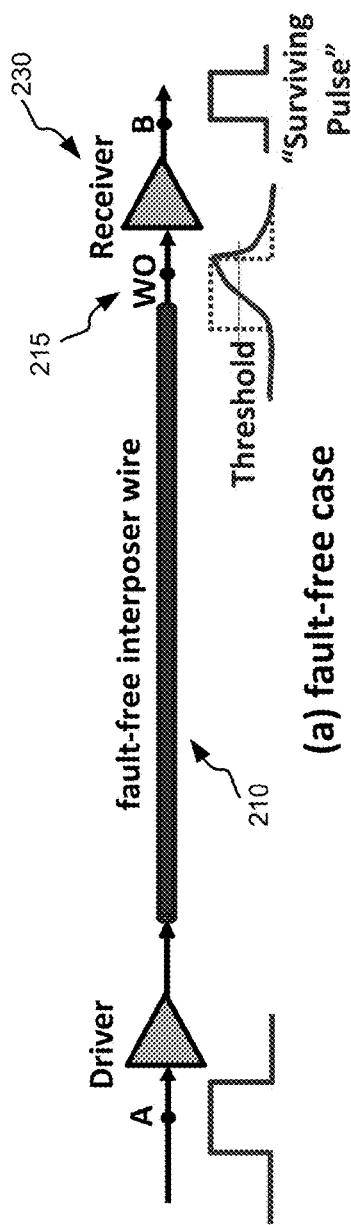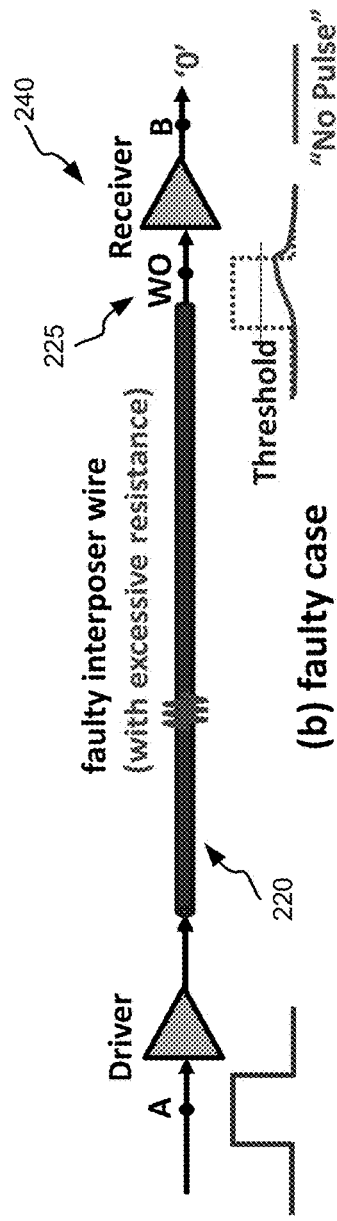
FIG. 2A
FIG. 2B

METHOD AND CIRCUIT OF PULSE-VANISHING TEST

RELATED APPLICATIONS

This application claims priority to U.S. Provisional Patent Application No. 61/827,502, filed on May 24, 2013, and U.S. Provisional Patent Application No. 61/846,515, filed on Jul. 15, 2013, both of which are incorporated entirely herein by reference.

FIELD OF THE INVENTION

The present invention relates to the field of integrated circuit (IC) testing technology. Various implementations of the disclose techniques may be particularly useful for testing interconnects between integrated circuits.

BACKGROUND OF THE INVENTION

Interconnect testing has drawn renewed attention recently due to the development of interposer-based 2.5-D (two-and-half-dimensional) stacked integrated circuits and through-silicon-via (TSV) based 3-D (three-dimensional) stacked integrated circuits. In these types of integrated circuits, multiple dies are bonded together through interconnects going through chips to reduce power consumption and to increase bandwidth and integration. The interconnect fabrication mechanisms can lead to not only catastrophic defects but also parametric defects. It is thus necessary to test interconnects thoroughly.

Recently, test methods for TSVs either in the pre-bond stage or in the post-bond stage have been proposed. Some of them target functional faults such as stuck-at faults or completely open faults, while some other methods can also detect parametric faults such as resistive open faults or leakage faults. To perform some of these methods, analog circuitry is required in the design-for-circuit (DFT) circuit. In general, a method for testing TSVs can be employed to test interposer wires after some modification.

For high-speed interconnect test, one needs to control the so-called "launch-to-capture timing interval" (i.e., the timing interval between the time when a test stimulus is launched at a pitcher cell and the time when a capture cell latches the result). In a method disclosed in Wang et al, "Post-bond testing of the silicon interposer and micro-bump C4 interconnects for Si-carrier SOP applications," Proc. of IEEE Asian Test Symp., pp. 147-152, 2013 (referred to as Wang hereinafter), double pulses are needed (similar to the one used in a launch-off-capture type of at-speed logic test). The timing signals for the pitcher cell and the catcher cell have to be separated so that the transition is launched at an edge of one pulse and captured at an edge of the other pulse. If the timing signals of the pitcher and the catcher cells are synchronized, then the launch-to-capture interval equals the timing difference between the double pulses (which is usually the functional clock cycle time). However, the timing signals could arrive at the pitcher cell (in a specific die) to the catcher cell (in another die) at different times. If the timing difference is taken into account, then, the launch-to-capture timing interval could be different from what has been anticipated. This problem is referred to as across-die timing skew problem.

The synchronous method disclosed in Wang may be employed to resolve the problem. This method is to assume that the timing signals at the pitcher and catcher cells are already synchronized (which is true when every interconnect is connecting a functional flip-flop to a functional flip-flop), or clock synchronization techniques are particularly invoked to remove the timing skew problem. A drawback for the synchronization method is that it needs an extra clock synchronization tree for a large number of pitcher and catcher cells scattering multiple dies.

Another method free of the across-die timing skew problem was disclosed in Lin et al., "Small Delay Testing for TSVs in 3D ICs," IEEE Proc. of Design Automation Conf., June 2012. It uses a variable-output-threshold (VOT) technique to enhance a conventional oscillation test method. In this method, two oscillation signals are produced, with their difference reflecting the delay of the TSV under test. After post-processing, a TSV with a delay fault can be identified. This method was enhanced by a wire-length normalization technique, disclosed in Huang et al., "Delay Testing and Characterization of Post-Bond Interposer Wires in 2.5-D ICs", Proc. of Int'l Test Conf. (ITC), September 2013, to make it further suitable for interposer wires of diverse wire lengths. Even though these methods are effective for detecting parametric faults, post-processing of the measurement data (such as outlier analysis) may be needed to perform fault detection and/or diagnosis.

Due to the limitations of these current methods, it is desirable to develop a new method that does not require a cross-die zero-skew clock signal, sophisticated post-processing, or analog-based test circuitry.

BRIEF SUMMARY OF THE INVENTION

Various aspects of the disclose techniques relate to techniques of testing interconnects in stacked designs.

In one aspect, there is a method, comprising: applying a single-pulse signal, generated by a first circuit state element on a first die, to a first end of an interconnect; and capturing, using a clock port of a second circuit state element on a second die, the single-pulse signal at a second end of the interconnect. The interconnect may be an interposer wire. The single-pulse signal may be generated by applying a double-pulse signal to a clock port of the first circuit state element. The first circuit state element, the second circuit state element or both may be flip-flops. A cell comprising the first circuit state element may be referred to as a launch cell and a cell comprising the second circuit may be referred to as a capture cell. The launch cell may be a boundary scan cell on the first die. The capture cell may be a boundary scan cell on the second die.

In another aspect, there is an integrated circuit, comprising: a first die comprising a first circuit state element configurable to generate a single-pulse signal; a second die comprising a second circuit state element configurable to capture the single-pulse signal using a clock port; and an interconnect through which the single-pulse signal travels from the first die to the second die. The interconnect may be an interposer wire. The single-pulse signal may be generated by applying a double-pulse signal to a clock port of the first circuit state element. The first circuit state element, the second circuit state element or both may be flip-flops. A cell comprising the first circuit state element may be referred to as a launch cell and a cell comprising the second circuit may be referred to as a capture cell. The launch cell may be a boundary scan cell on the first die. The capture cell may be a boundary scan cell on the second die.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclose techniques. Thus, for example, those skilled in the art will recognize that the disclose techniques may be embodied or carried out in a manner that achieves or optimizes one advantage or group of advantages as taught herein without necessarily achieving other objects or advantages as may be taught or suggested herein.

BRIEF DESCRIPTION OF THE DRAWINGS

FIG. 2A uses a fault-free interconnect to illustrate a pulse-vanishing method for testing faulty interconnects that may be implemented according to various embodiments of the disclose techniques.

FIG. 2B uses a faulty interconnect to illustrate a pulse-vanishing method for testing faulty interconnects that may be implemented according to various embodiments of the disclose techniques.

DETAILED DESCRIPTION OF THE INVENTION

Figure 1A:
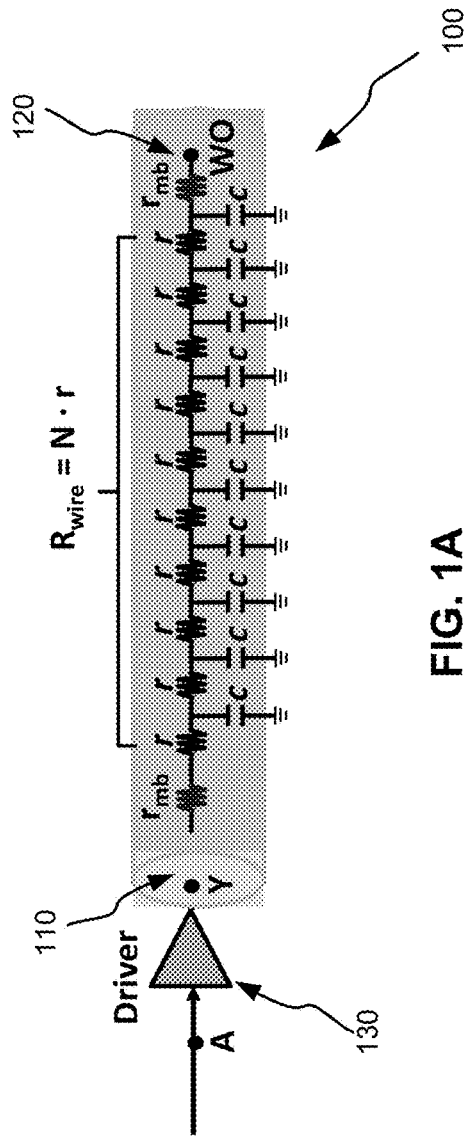
FIG. 1A illustrates an electrical model of a fault-free interconnect.

Various aspects of the present disclose techniques relate to techniques of testing interconnects in stacked designs. Two examples of interconnects are TSVs for three-dimensional designs and interposers for two-and-half-dimensional designs. In the following description, numerous details are set forth for the purpose of explanation. However, one of ordinary skill in the art will realize that the disclose techniques may be practiced without the use of these specific details. In other instances, well-known features have not been described in details to avoid obscuring the present disclose techniques.

Some of the techniques described herein can be implemented in software instructions stored on one or more non-transitory computer-readable media, software instructions executed on a processor, or some combination of both. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, a "punched" surface type device, or a solid state storage device. Some of the disclosed techniques, for example, can be implemented as part of an electronic design automation (EDA) tool. Such methods can be executed on a single computer or on networked computers.

Also, as used herein, the term "design" is intended to encompass data describing an entire integrated circuit device. This term also is intended to encompass a smaller group of data describing one or more components of an entire device, however, such as a portion of an integrated circuit device. Still further, the term "design" also is intended to encompass data describing more than one microdevice, such as data to be used to form multiple microdevices on a single wafer.

The present disclosure also includes some hardware drawings. These drawings are only illustrative and are non-limiting. For illustrative purposes, the size of some of the elements in the drawings may be exaggerated and not drawn on scale, and some elements in the drawings may be omitted.

FIG. 1A illustrates an electrical model of a fault-free interconnect (TSV or interposer wire). An interconnect 100 can be viewed as a multi-segment RC network. Node Y (110) and node WO (120) denote the start-point and the end point of the interconnect 100, respectively, based on the electrical signal direction. Driver 130 is a logic gate that drives the interconnect 100. The resistance $r_{mb}$ of a microbump between a die and an interposer is 1 mΩ typically. The lumped series resistance $R_{wire}$ consists of N resistance segments with each segment denoted as r: $R_{wire}=N \cdot r$. The lumped capacitance of the interconnect is also split into N capacitance segments with each segment capacitance denoted as c: $C_{wire}=N \cdot c$.

Figure 1B:
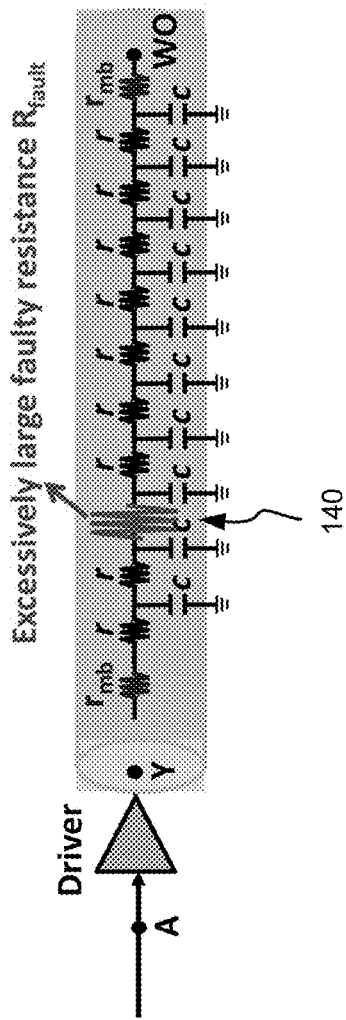
FIG. 1B illustrates an electrical model of a faulty interconnect.

FIG. 1B illustrates an electrical model of a faulty interconnect. A resistance segment 140 is larger than its normal value, leading to excessively large series resistance $R_{wire}$. The excessively large series resistance $R_{wire}$ can cause an unacceptable propagation delay.

FIGS. 2A and 2B illustrate a pulse-vanishing method for testing faulty interconnects that may be implemented according to various embodiments of the disclose techniques. In the pulse-vanishing method, a short-duration pulse signal is applied to an interconnect (a fault-free interposer wire 210 in FIG. 2A/a faulty interposer wire 220 in FIG. 2B). The width of the short-duration pulse may be chosen to be equal to the system clock cycle time. Due to the loading effect of the potentially long interposer wire, the signal arriving at the receiving end (215 in FIG. 2A/225 in FIG. 2B) tends to have slow rising and falling edges. If the interposer wire is fault-free as illustrated in FIG. 2A, then the pulse signal could still manage to have a sufficient swing before reaching the receiving end (215 in FIG. 2A). This pulse waveform is said to have "survived" the journey through the interposer wire and will be refreshed to a sharper shape after passing a logic gate at the receiving end, namely a "receiver" (230 in FIG. 2A). On the other hand, if the interposer wire is faulty with excessive resistance as illustrated in FIG. 2B, then the pulse signal may vanish altogether as observed at the receiver's output (240 in FIG. 2B). This phenomenon is due to the fact that a faulty interposer wire could be too resistive and therefore the voltage waveform is so distorted at the receiving end (225 in FIG. 2B) that it never reaches the threshold voltage level of the receiver 240. As a result, the resulting pulse wave at the receiving end 225 is considered to be a glitch and "filtered" by the receiver 240, leading to no pulse signal output.

Figure 3:
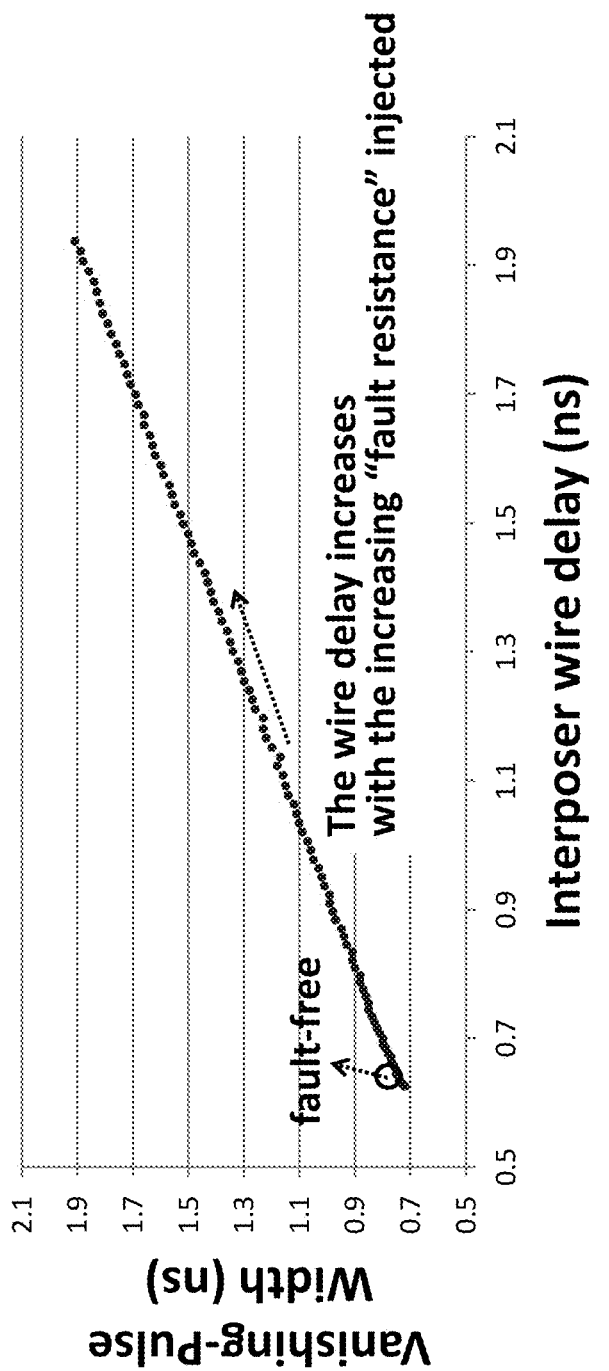
FIG. 3 illustrates how that vanishing pulse width tracks interposer wire delay linearly even under faulty conditions using an interposer wire with a resistive open fault.

The critical condition for a pulse signal to vanish is found to be correlated to the interposer wire delay. The critical condition may be represented by vanishing pulse width. The vanishing pulse width defines a threshold value below which a pulse signal will not pass through a receiver. Based on SPICE simulation with a 90-nm CMOS process, the delay and the vanishing pulse width for a 1000 μm long interposer wire are 609.6 ps and 691 ps, respectively. FIG. 3 illustrates how that the vanishing pulse width tracks the interposer wire delay linearly even under faulty conditions using an interposer wire with a resistive open fault (the injected fault resistance increasing gradually from 100Ω to 10 kΩ in an increment of 100Ω). The linear relationship indicates that the pulse width of the applied test pulse may be adjusted corresponding to the test threshold for parametric delay test. On the other hand, we can also simply set the test pulse-width to be the system clock cycle time to check if there is any faulty interposer wire whose propagation delay is roughly larger than the system clock cycle time.

Figure 4:
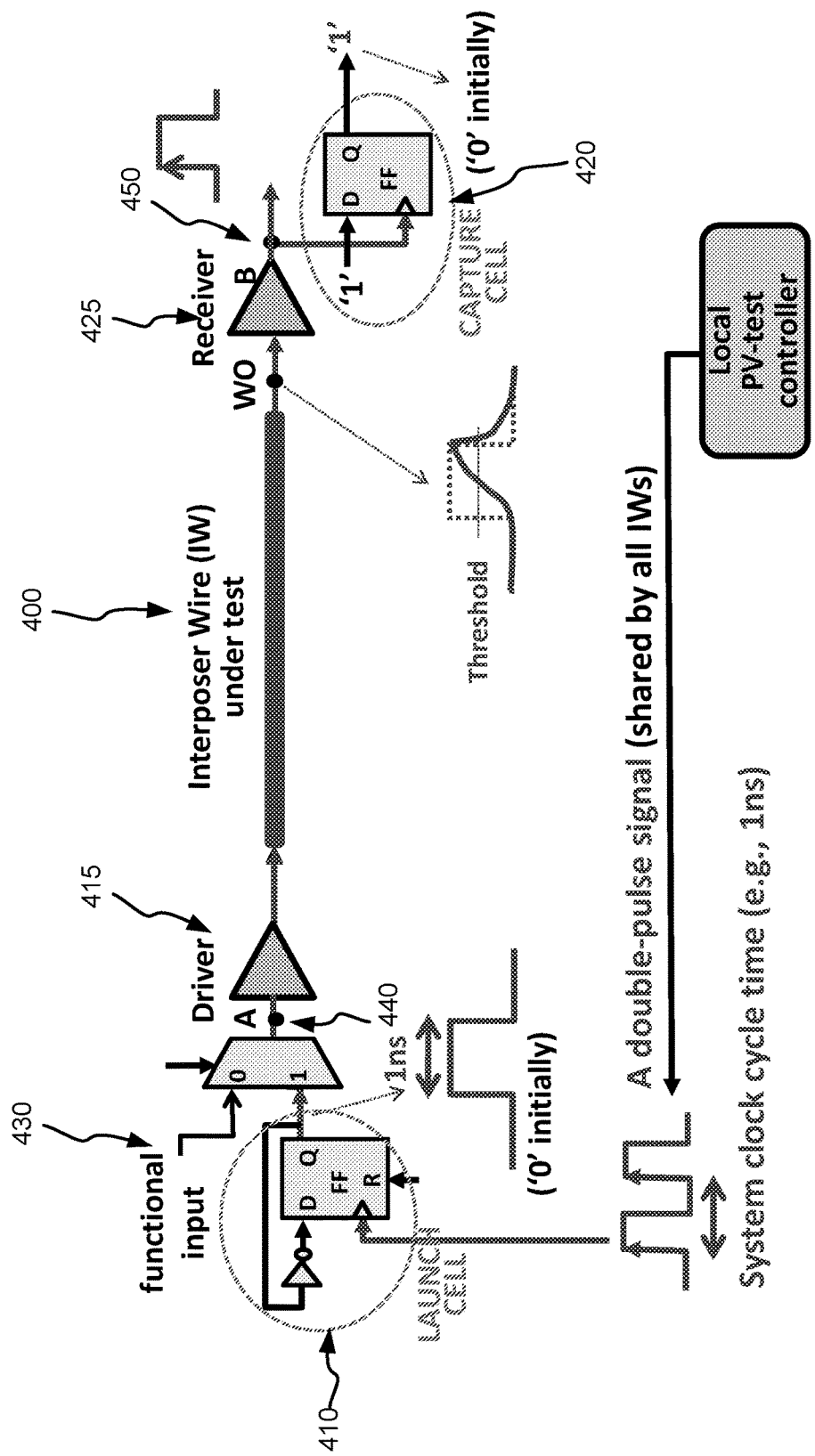
FIG. 4 illustrates an example of pulse-vanishing test circuitry that may be implemented according to various embodiments of the disclose techniques.

FIG. 4 illustrates an example of pulse-vanishing test circuitry that may be implemented according to various embodiments of the disclose techniques. In the figure, a launch cell 410 and a capture cell 420 are located at the driver (415) side and the receiver (425) side of an interposer wire 400, respectively. The launch cell 410 is responsible for launching the required "pulse signal" as the test stimulus in test mode, while the capture cell 420 is used to detect whether there is an arriving pulse signal within a designated test cycle or the arriving pulse signal is above a certain threshold. Each of these two cells may incorporate a flip-flop. A functional input 430 denotes the original input signal in functional mode.

Before each test cycle, initialization may be needed: both node A 440 (the input of the driver 415) and node B 450 (the output of the receiver 425) need to be set to '0'. This may be achieved by the asynchronous reset of the flip-flop in the launch cell 410 and by scan-shifting "0" to the capture cell 420.

In the launch cell 410, the clock port is supplied with a "double-pulse" signal that may be generated by a local test controller. The flip-flop in the launch cell 410 is configured as a toggle-type flip-flop to convert this double-pulse signal into a desired single-pulse signal as the test stimulus.

Using a single-pulse signal directly may not be able to control the pulse-width of the test stimulus accurately as a pulse may shrink or expand when passing through a long routing path (e.g. from the test controller to a launch cell 410). By contrast, the time interval between two rising edges in a double-pulse signal is immune to the routing path.

In the capture cell 420, the clock port of the flip-flop is driven by the output of the receiver 425. Since the flip-flop has been initialized to '0' before the test cycle and its input is also tied to '1', it will become '1' if its clock port is triggered by an arriving pulse signal through the interposer wire, indicating a 'passing' condition. Otherwise, it will remain '0' if there is no pulse signal, indicating a 'failing' condition at the end of the test cycle.

Figure 5A:
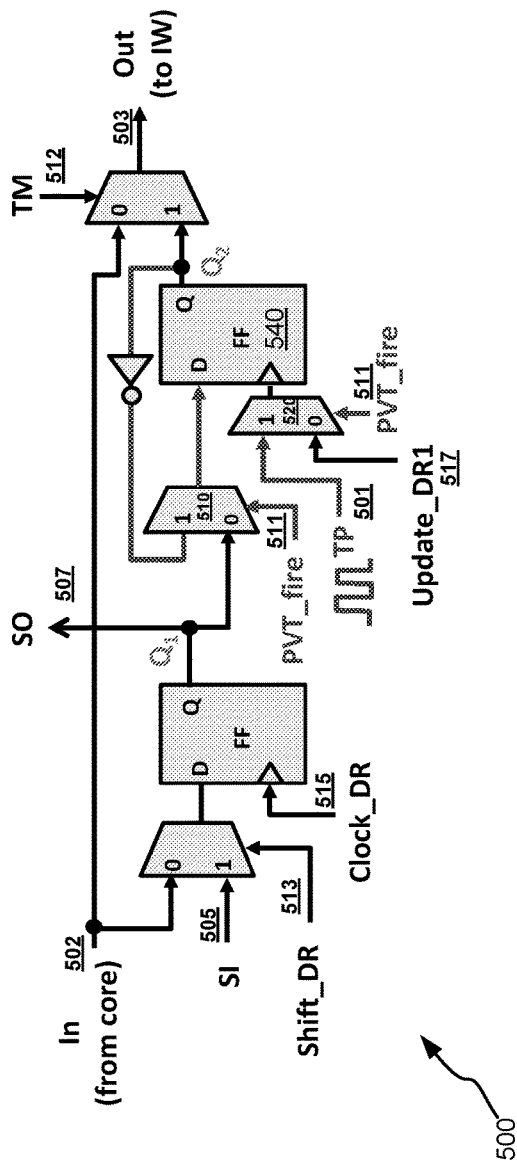
FIG. 5A illustrates an example of using an IEEE-1149.1-compliant boundary scan cell as a launch cell.

Boundary scan cells compliant with the IEEE-1149.1 or IEEE 1500-compliant test wrappers may be utilized for the pulse-vanishing test. FIG. 5A illustrates an example of using an IEEE-1149.1-compliant boundary scan cell as a launch cell and FIG. 5B illustrates an example of using an IEEE-1149.1-compliant boundary scan cell as a capture cell.

In FIG. 5A, there is one extra data type of input signal for a launch cell 500, TP (501), in addition to the original data signals of a boundary scan cell, In (502), Out (503), SI (505), and SO (507). Also, there is one extra control signal, PVT_fire (511), in addition to the original control signals, TM (512), Shift_DR (513), Clock_DR (515), and Update_DR1 (517). By contrast, there is no extra data type of signal for a capture cell 550, as shown in FIG. 5B. Nonetheless, the capture cell 550 does have PVT_fire (551) as an extra control signal, in addition to the original control signals (TM (552), Shift_DR (553), Clock_DR (555), and Update_DR2 (557)). The control signals TM (512), Shift_DR (513), and Clock_DR (515) may use the same signals as the control signals TM (552), Shift_DR (553), and Clock_DR (555), respectively. The Update_DR1 (517) and the Update_DR2 (557) may use the same signal during normal boundary scan operations but may use different ones for the pulse-vanishing test.

As shown in FIG. 5A, two multiplexers, 510 and 520 are inserted into a typical boundary scan cell that serves as the launching cell for the pulse-vanishing test. These two multiplexers are both controlled by the PVT_fire (511). The PVT_fire (511) is set to '1' in a particular test clock cycle whenever the launch cell 500 needs to launch (or 'fire') a test pulse. In a PV-test session, an initialization operation that takes a number of scan-shifting test clock cycles to set the content of a flip-flop 540, or namely $Q_2$, to '0', may need to be performed before launching a pulse. The launching often takes only one test clock cycle. The initialization may be performed using normal boundary scan test operations, during which the PVT_fire (511) stays '0'.

Figure 5B:
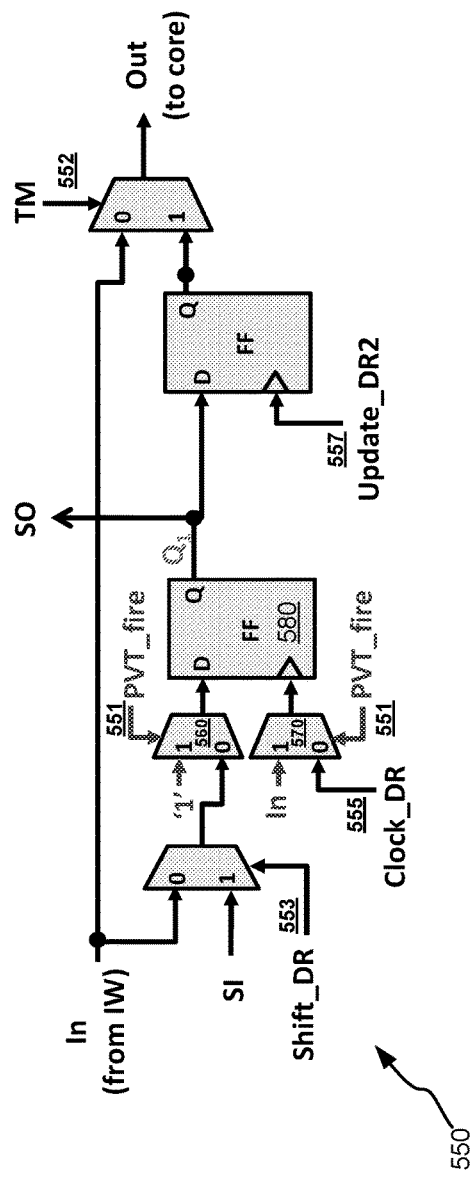
FIG. 5B illustrates an example of using an IEEE-1149.1-compliant boundary scan cell as a capture cell.

As shown in FIG. 5B, two multiplexers, 560 and 570 are inserted multiplexers are inserted into a typical boundary scan cell that serves as the capturing cell for the pulse-vanishing test. These two multiplexers are both controlled by the PVT_fire (511). Similar to the flip-flop 540 in the launching cell, the content of a flip-flop 580, or namely $Q_1$, is initialized to '0' by normal boundary scan operations first, during which the PVT_fire (511) stays '0'. Then, a pulse-capture cycle is performed by setting PVT_fire (511) to '1', so that the clock port of the flip-flop 580 is driven by the input signal (incoming from the interposer wire) and the data port is tied to constant '1'. Note that the multiplexer 560 can be replaced by an OR gate to reduce the cost.

Figure 6:
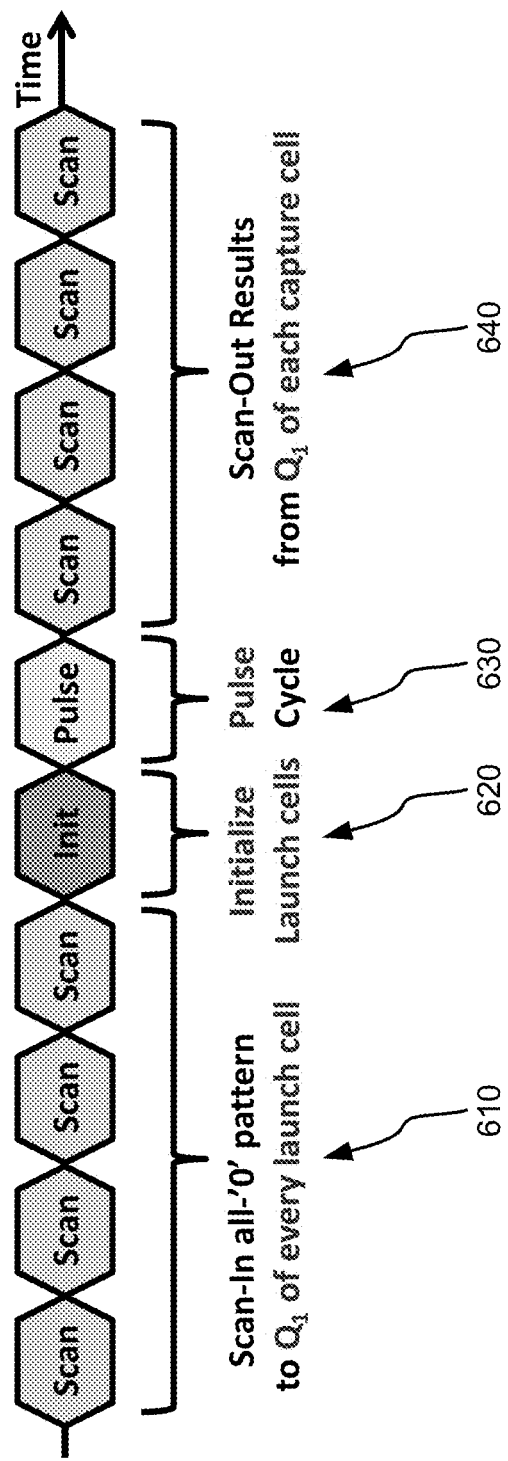
FIG. 6 illustrates an example of a pulse-vanishing test flow.

FIG. 6 illustrates an example of a pulse-vanishing test flow. The pulse-vanishing test flow includes four stages. In stage 610, an initialization process incorporating a number of boundary scan test cycles to scan all-'0' pattern into $Q_1$ of every launch cell and capture cell is executed. In stage 620, the value of $Q_1$ is copied to $Q_2$ in every launch cell to complete the initialization. This is completed in one boundary scan test cycle. In this particular stage, the values of the Update_DR1 (517) and the Update_DR2 (557) are different. The overall test controller may enforce an "active pulse" at the Update_DR1 (517) to cause the desired operation in all launch cells. However, the Update_DR2 (557) should remain stable so that all capture cells will take no action. If such a protocol is not observed, then the results might be wrong when the pulse-vanishing test is employed to test bridging faults as discussed in detail below.

In stage 630, also a one-cycle stage, the launch cells fire a pulse signal and the capture cells detect if there is an arriving pulse. As explained previously, if a pulse signal is detected by a capture cell, its $Q_1$ will be set to '1', indicating a 'fault-free' condition. Otherwise, its $Q_1$ will remain '0', indicating a 'faulty' condition. It is notable that in this stage, the PVT_fire (511) is set to '1'. In stage 640, a number of boundary scan test cycles is taken to scan out the pass/fail results stored in the capture cells.

Figure 7:
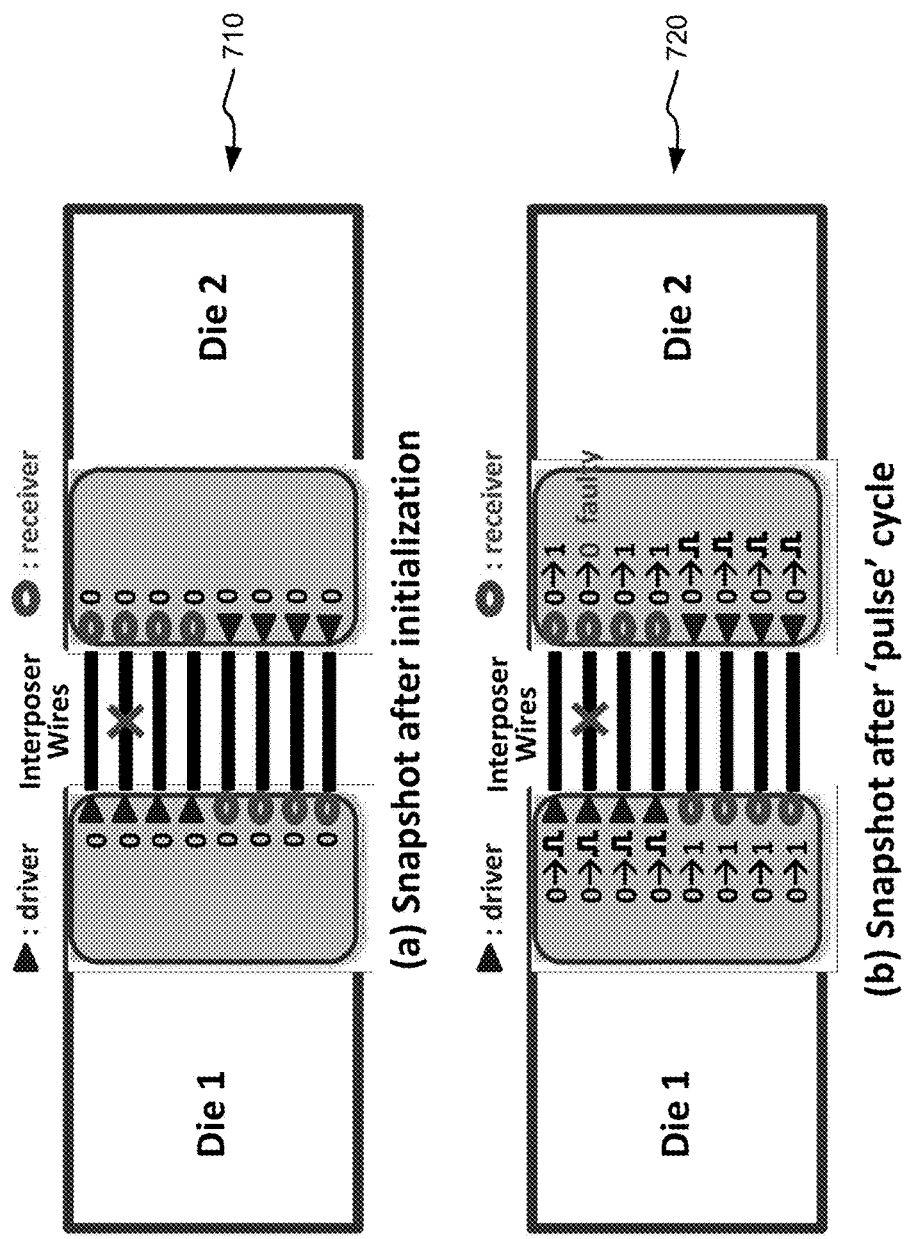
FIG. 7 illustrates an example of two snapshot images of launch cells and capture cells during a pulse-vanishing test session.

FIG. 7 illustrates an example of two snapshot images of the launch cells and capture cells during a pulse-vanishing test session. Snapshot 710 is after the initialization stage 610 and snapshot 720 is after the 'pulse' cycle as shown. The content of a launch cell is referred to output of its $2^{nd}$ flip-flop (540 in FIG. 5A), i.e., $Q_2$, while the content of a capture cell is referred to its $1^{st}$ flip-flop (580 in FIG. 5B), i.e., $Q_1$. In this example, the $2^{nd}$ interposer wire running from left to right has been assumed to be faulty, causing a failing bit of '0' at $Q_1$ of its corresponding capture cell at the end of the pulse cycle.

Figure 8:
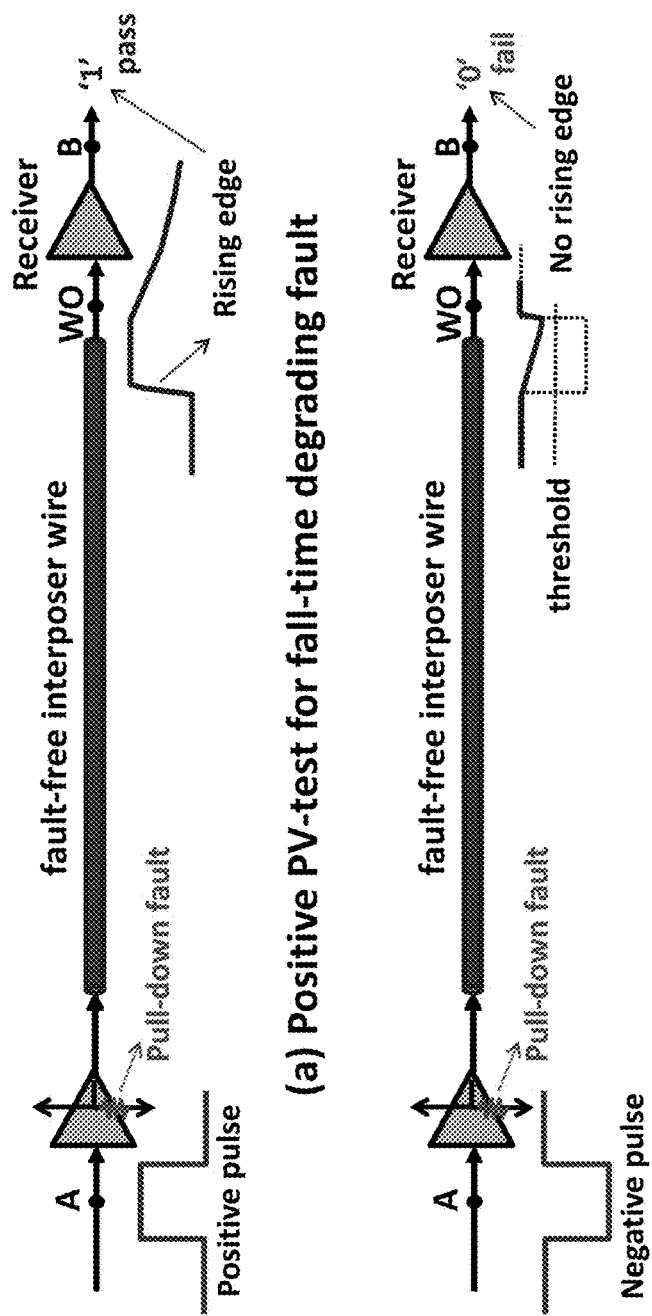
FIG. 8 illustrates why a positive-pulse-based test may not be able to detect a fault that causes only fall-time degradation.

The examples of the pulse-vanishing test illustrated in FIGS. 2A, 2B and 4 employ a positive pulse (i.e., 0-1-0 pulse). This is aimed to detect a fault that causes severe "rise-time degradation". When a pulse propagates through a high-resistance faulty interposer wire, the rise time and the fall time are often both degraded, and thus the positive-pulse-based test will be effective. However, if a fault causes only fall-time degradation (e.g., a fault that degrades only the pull-down capability of the driver of an interposer wire), then the positive-pulse-based test may not be able to detect it, as illustrated in FIG. 8. The remedy for this type of "fall-time degrading fault" is to apply a negative pulse-based test: a negative pulse (i.e., 1-0-1 pulse) is used instead as the test stimulus, as also illustrated in FIG. 8.

Figure 9:
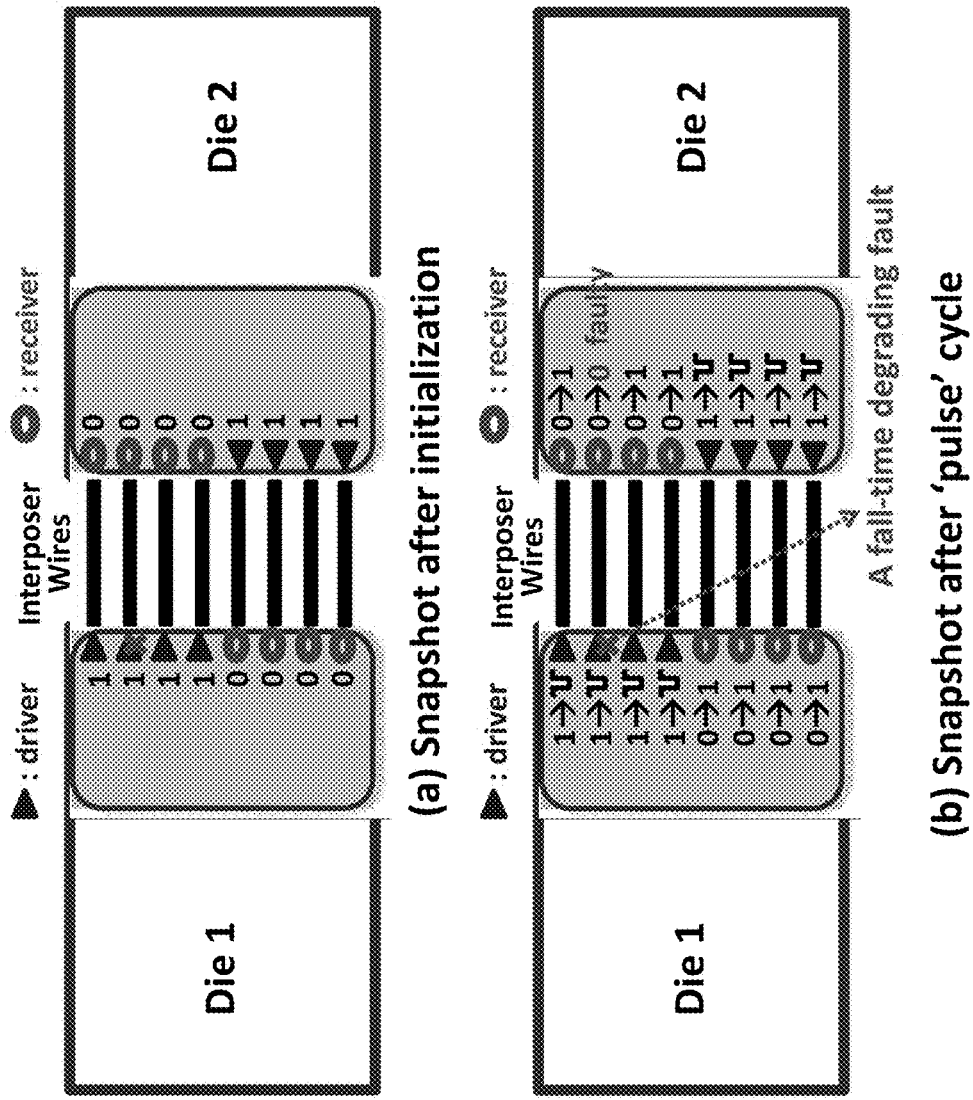
FIG. 9 illustrates a negative-pulse-based test with two snapshot images of launch cells and capture cells.

To perform a negative pulse-based test, the initialization pattern applied to the launch cells (but not the capture cells) may need to be changed. Rather than applying all-'0' pattern for both launch and capture cells as in a positive pulse-based test, launch cells are initialized to all-'1' pattern and all capture cells to all-'0' pattern, as shown in FIG. 9.

Figure 10:
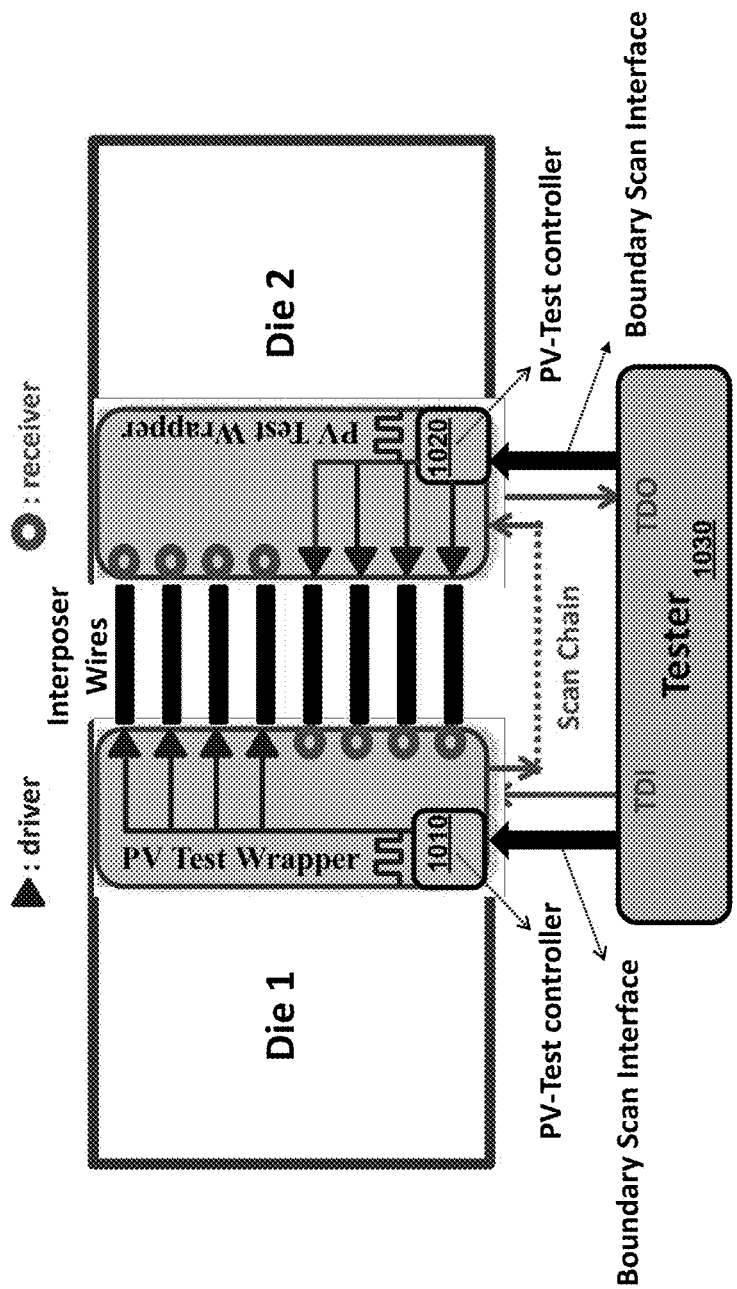
FIG. 10 illustrates an example of overall test architecture for a pulse-vanishing test that may be employed by various embodiments of the disclosed techniques.

FIG. 10 illustrates an example of overall test architecture for the pulse-vanishing test that may be employed by various embodiments of the disclosed techniques. There is a local PV-test controller in each die (e.g., 1010 and 1020), responsible for generating the required double-pulse signal, namely 'TP' previously. This signal is broadcasted to all launch cells as their test stimuli. All PV-test controllers operate in locked steps by receiving the global boundary-scan control signals from a tester 1030. These chip-level global control signals among dies, requiring only low-speed connections (e.g., 1-10 MHz), need not be included in the high-speed test. The capture cells of all dies are further connected in daisy chain through the TDI-TDO signal pairs. The bit-stream over this daisy-chain starts from the tester, travelling through every launch cell and every capture cell in every die in sequence before returning to the tester. The above architecture can be extended to a 2.5-D IC with more than 2 dies.

Figure 11:
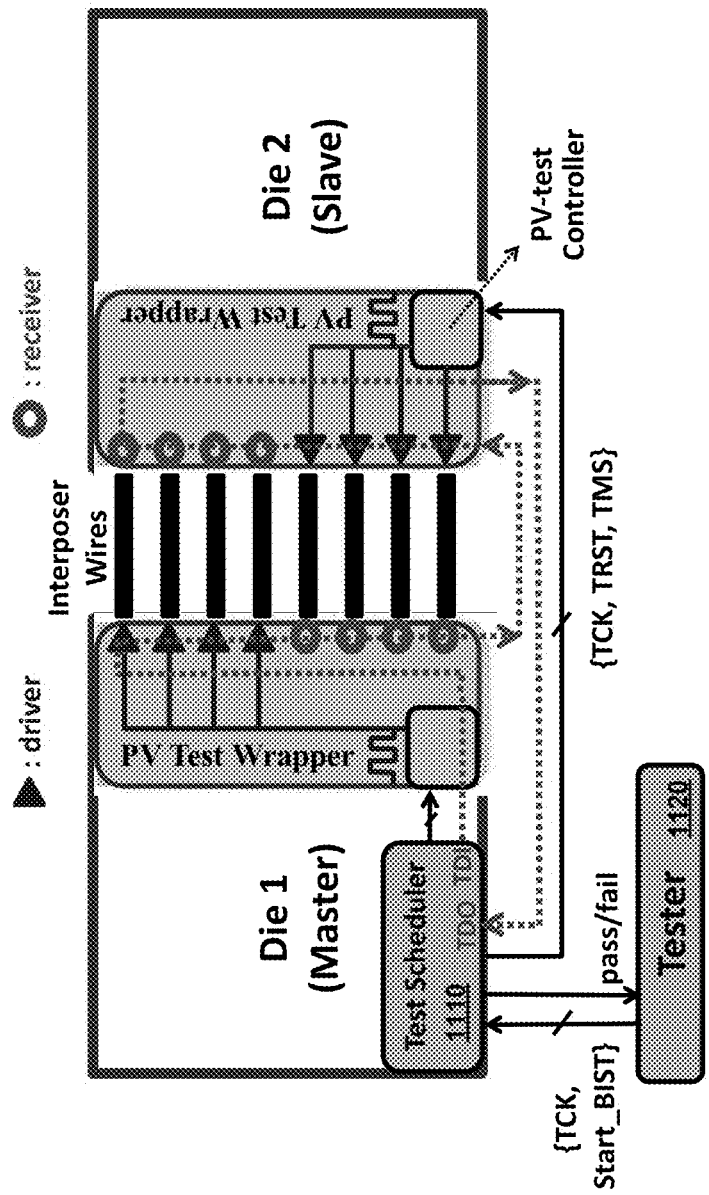
FIG. 11 illustrates an example of overall test architecture modified to support at-speed Built-In Self-Test (BIST).

The above test architecture can be easily modified to support at-speed Built-In Self-Test (BIST), as shown in FIG. 11. A first die 1110 is selected as the master die in which a BIST controller is now responsible for regulating the entire PV-test procedure. An external tester 1120 may initiate the BIST test session by sending test clock signal 'TCK' and a proper BIST enabling signal, e.g., 'Start_BIST', to the BIST controller in the master die and then wait for the final pass/fail response.

Figure 12:
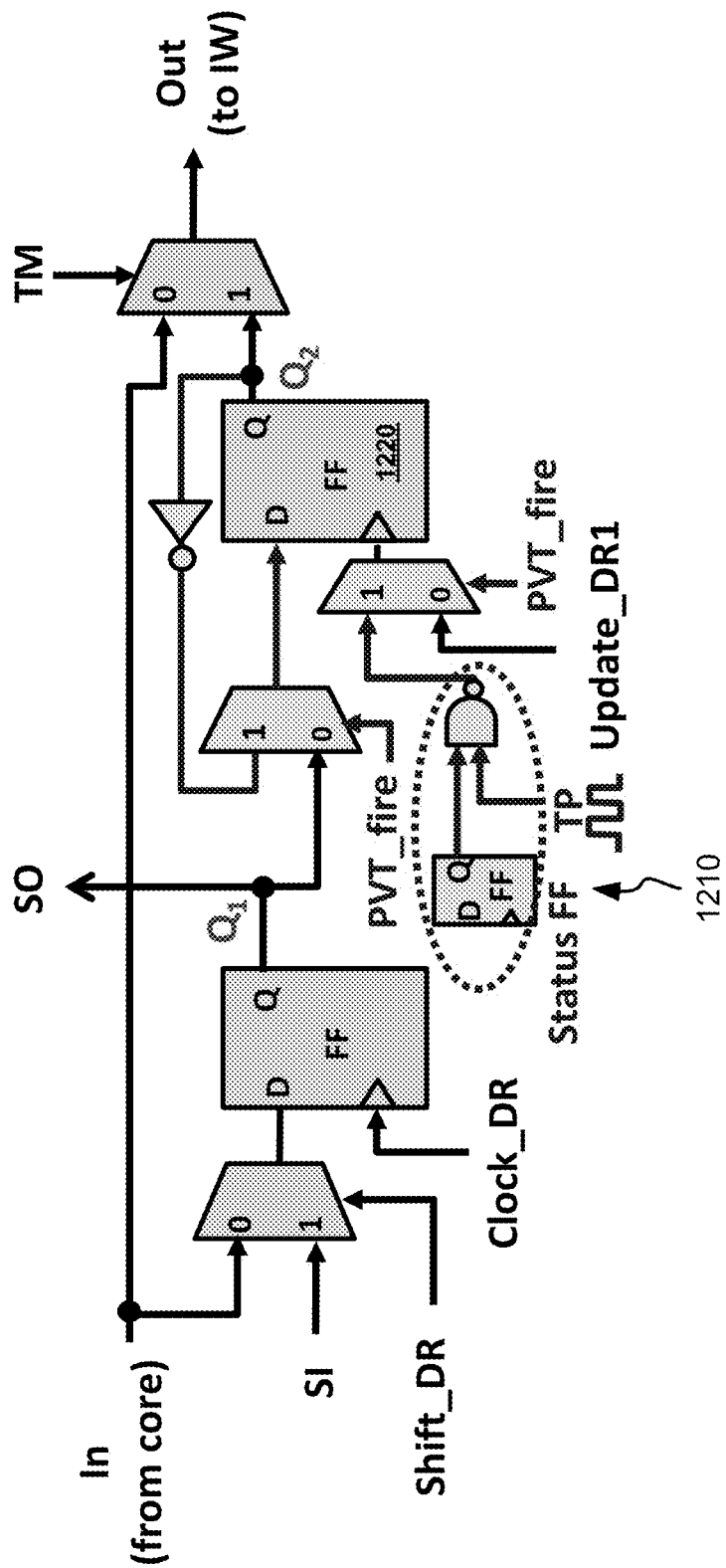
FIG. 12 illustrates a launch cell that can detect a hard or resistive bridging fault occurring between two interconnects.

The disclosed techniques can be applied to detect a hard or resistive bridging fault occurring between two interconnects. This may be done by modifying the launch cell shown in FIG. 5A slightly and employing a one-test-pulse-at-a-time scheme, as shown in FIG. 12. A status flip-flop 1210 is inserted into each launch cell to decide whether it is a designated "active launch cell" to fire a test pulse within a particular test clock cycle. The content of this status flip-flop 1210 is used to gate the test pulse signal, i.e., 'TP'. When the content is '1', a launch cell fires a test pulse in a "pulse cycle". Otherwise, the output of the launch cell remains in its initial value since no pulse is applied to the clock port of the flip-flop 1220. Since the outputs of all launch cells except the active launch cell stay at their initialized values, they act as 'aggressors' when there is a bridging fault between any of them and the active interposer wire. Thus, the pulse signal travelling through the active interposer wire will experience rise-time degradation or fall-time degradation. If the degradation is sufficient, the pulse will vanish altogether to expose the bridging fault.

Figure 13:
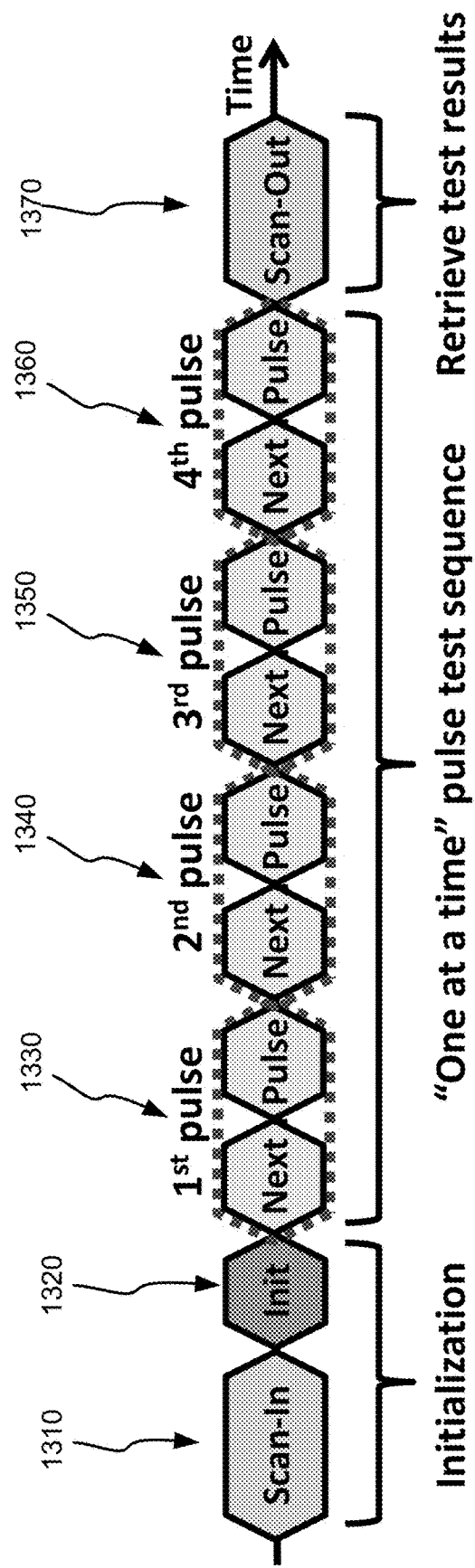
FIG. 13 illustrates an example of a pulse-vanishing test flow that may be used for testing bridging fault.

The status flip-flops 1210 of all launch cells may form a 'status' scan chain themselves. The test controller supports another operation, called 'Next' which shifts an active bit of '1' through the 'status' scan chain one stage at a time. An example of a pulse-vanishing test flow that may be used for testing bridging faults is depicted in FIG. 13. After a scan-in stage 1310 and an initialization cycle 1320, the launch cells are activated one at a time through four pairs of Next and Pulse operations, 1330-1360. At the end (1370), the results are retrieved from the contents of the capture cells.

The disclosed test techniques are threshold-based: a fault may be detected when the delay caused by an interconnect exceeds a specific test threshold. In some cases, the delay budget for an interposer wire is not equal to the system clock cycle time. Furthermore, the delay budgets for different interconnects might be different. Here, the delay budget refers to the specific maximum amount of time a signal is allowed to spend when traveling across a specific interposer wire. These issues may be ignored if the objective is simply to detect gross delay faults that cause delays larger than the system clock cycle time. However, if tightening of the test threshold is desired, then there are two options: (1) use a short test pulse, or (2) use the concept of "driver downsizing".

The first option of using a short test pulse relies on the clock generator circuit to support programmable clock cycle time. Fine resolution of controlling the clock cycle time can be achieved with the aid of cell-based phase-locked loops. The detail can be found in Y.-C. Chang, S.-Y. Huang, C.-W. Tzeng, and Y. Yao, "A Fully Cell-Based Design for Timing Measurement of Memory," Proc. of IEEE Int'l Conf. of Testing, (ITC), November 2011, which is incorporated herein by reference.

Figure 14:
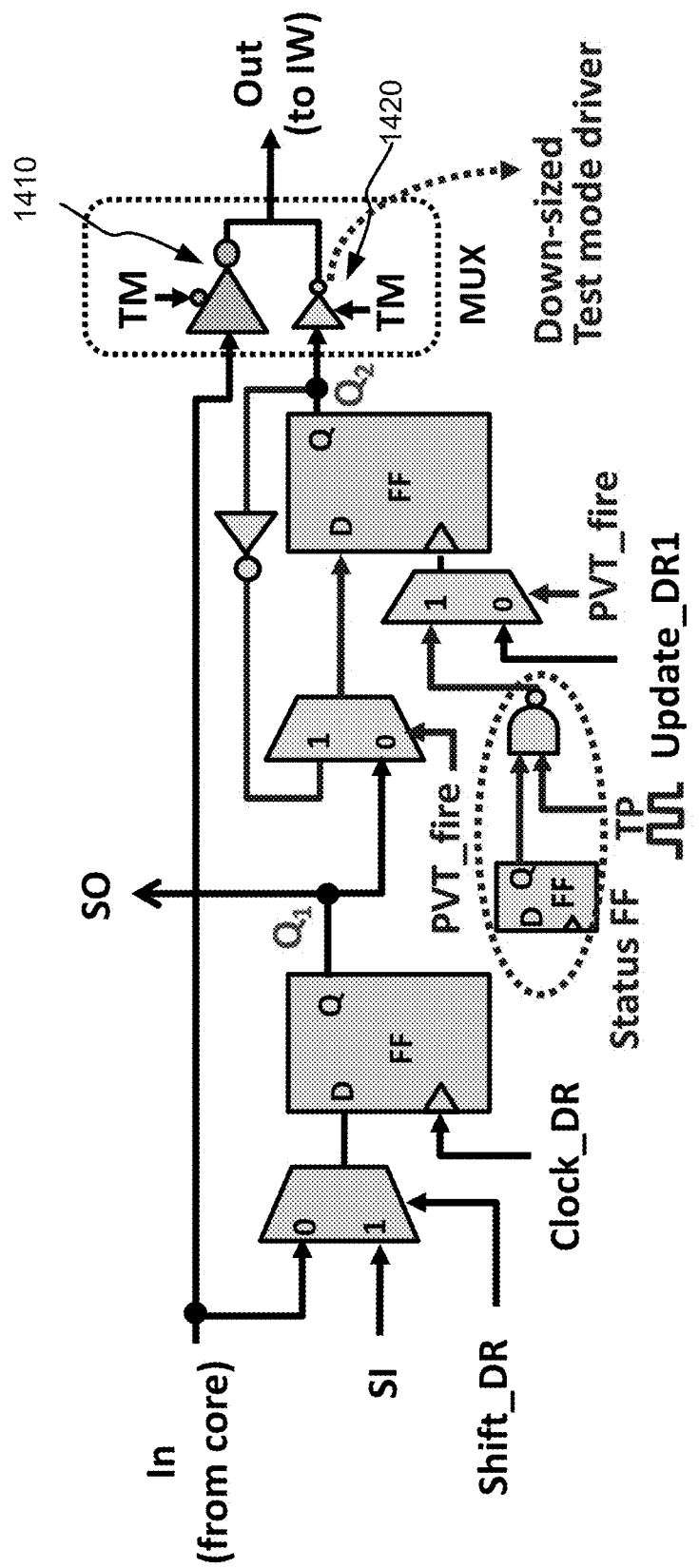
FIG. 14 illustrates an example of a down-sized driver for a test that has a tightening test threshold.

The second option employs a down-sized driver in the test mode than that in the functional mode. The launch cell shown in FIG. 12 is modified by replacing the output multiplexer with two shunt tri-state buffers, one 1410 for functional mode, the other 1420 for test mode, as illustrated in FIG. 14. The test mode tri-state buffer 1420 is a down-sized driver. The effect of this down-sizing will make the interconnect driven by this launch cell slower in test mode than in functional mode. In some sense, the delay of a fault (if existed) may be amplified in test mode so that the fault is more likely to be detected.

While the disclose techniques has been described with respect to specific examples including presently preferred modes of carrying out the disclose techniques, those skilled in the art will appreciate that there are numerous variations and permutations of the above described systems and techniques that fall within the spirit and scope of the disclose techniques as set forth in the appended claims.

What is claimed is:

1. A method, comprising:
    applying a single-pulse signal, generated by a first circuit state element on a first die, to a first end of an interconnect; and
    capturing, through a clock port of a second circuit state element on a second die, the single-pulse signal at a second end of the interconnect, wherein during the applying and the capturing, a constant signal of one logic value is applied to an input port of the second circuit state element, the one logic value being opposite to a logic value stored in the second circuit state element before the capturing.

2. The method recited in claim 1, wherein the first circuit state element, the second circuit state element or both are flip-flops.

3. The method recited in claim 1, wherein the interconnect is an interposer wire and the first die and the second die are two-and-half-dimensional stacked integrated circuits.

4. The method recited in claim 1, wherein the first circuit state element is comprised by a boundary scan cell on the first die and the second circuit state element is comprised by a boundary scan cell on the second die.

5. The method recited in claim 1, wherein the single-pulse signal is generated by applying a double-pulse signal to a clock port of the first circuit state element.

6. An integrated circuit, comprising:
    a first die comprising a first circuit state element configurable to generate a single-pulse signal;
    a second die comprising a second circuit state element configurable to capture the single-pulse signal through a clock port of the second circuit state element, wherein during the generation of the single-pulse signal and the capture of the single-pulse signal, a constant signal of one logical value is applied to an input port of the second circuit state element, the one logic value being opposite to a logical value stored in the second circuit state element before the capture; and
    an interconnect through which the single-pulse signal travels from the first die to the second die.

7. The integrated circuit recited in claim 6, wherein the interconnect is an interposer wire and the first die and the second die are two-and-half-dimensional stacked integrated circuits.

8. The integrated circuit recited in claim 6, wherein the first circuit state element, the second circuit state element or both are flip-flops.

9. The integrated circuit recited in claim 6, wherein the first circuit state element is comprised by a boundary scan cell on the first die and the second circuit state element is comprised by a boundary scan cell on the second die.

10. The integrated circuit recited in claim 6, wherein the single-pulse signal is generated by applying a double-pulse signal to a clock port of the first circuit state element.

* * * * *